United States Patent [19]
Takenaka

[11] Patent Number: 5,099,305
[45] Date of Patent: Mar. 24, 1992

[54] PLATINUM CAPACITOR MOS MEMORY HAVING LATTICE MATCHED PZT

[75] Inventor: Kazuhiro Takenaka, Suwa, Japan

[73] Assignee: Seiko Epson Corporation, Tokyo, Japan

[21] Appl. No.: 723,681

[22] Filed: May 30, 1991

Related U.S. Application Data

[63] Continuation of Ser. No. 476,707, Feb. 8, 1990, abandoned.

[30] Foreign Application Priority Data

| Feb. 8, 1989 | [JP] | Japan | 1-28940 |
| Feb. 8, 1989 | [JP] | Japan | 1-28941 |
| Mar. 7, 1989 | [JP] | Japan | 1-54222 |
| May 19, 1989 | [JP] | Japan | 1-125804 |
| May 19, 1989 | [JP] | Japan | 1-125805 |

[51] Int. Cl.⁵ .................... H01L 27/02; H01L 29/68
[52] U.S. Cl. .................... 357/51; 357/23.5; 365/147; 365/145; 365/149
[58] Field of Search .............. 357/23.5, 51; 365/145, 365/147, 149

[56] References Cited

U.S. PATENT DOCUMENTS

| 3,832,700 | 8/1974 | Wu et al. | 357/23.5 |
| 4,149,302 | 4/1979 | Cook | 357/51 |
| 4,167,018 | 9/1979 | Ohba et al. | 357/51 |
| 4,873,664 | 10/1989 | Eaton, Jr. | 365/145 |
| 4,888,630 | 12/1989 | Patterson | 365/145 |
| 4,931,847 | 6/1990 | Gorda | 357/23.5 |

FOREIGN PATENT DOCUMENTS

| 57-180182 | 11/1982 | Japan . |
| 57-206068 | 12/1982 | Japan | 357/51 |

Primary Examiner—Andrew J. James
Assistant Examiner—Daniel N. Russell
Attorney, Agent, or Firm—Spensley Horn Jubas & Lubitz

[57] ABSTRACT

Non-volatile memories each employing a ferroelectric capacitor composed of a ferroelectric film formed on a diffused layer serving as a source or a drain. A lower electrode is composed mainly of a metal, while the ferroelectric film is connected to a high-concentration diffused layer at a contact hole. Formed on the high-concentration diffused layer is a refractory metal silicide on which to form the ferroelectric substance film.

6 Claims, 10 Drawing Sheets

PLATINUM CAPACITOR MOS MEMORY HAVING LATTICE MATCHED PZT

This is a continuation of application Ser. No. 07/476,707 filed on Feb. 8, 1990, now abandoned.

BACKGROUND OF THE INVENTION

The present invention relates to electrically rewritable non-volatile memories which employ a ferroelectric material.

Recently utilized semiconductor non-volatile memories of the prior art include EPROMs (Erasable Programmable Read-Only Memories or ultraviolet ray erasable non-volatile memories) and EEPROMs (Electrically Erasable Programmable Read-Only Memories or electrically rewritable non-volatile memories) which are typically based on MIS transistors and take advantage of the phenomenon that a surface potential of a silicon substrate is modulated by injecting electric charges from the silicon substrate into traps within an insulating gate or into a floating gate.

These non-volatile memories have certain inherent shortcomings in that, for example, the voltage required for rewriting is typically as high as 20 V or thereabouts, and the rewrite time is relatively long (e.g., several tens of milliseconds in the case of the EEPROM). In addition, the number of information rewriting operations is as small as approximately $10^5$ times. Therefore, repetitive use of such a memory presents a good number of problems.

Non-volatile memories which employ ferroelectric substances capable of having their polarization electrically inverted have a possibility of being ideal, because their write time is in principle the same as their read time, and because the polarization is maintained even when turning off the power supply.

Geometries of non-volatile memories using ferroelectric substances have already been described in, e.g., U.S. Pat. No. 4,149,302 where a capacitor composed of a ferroelectric substance is integrated on a silicon substrate, and U.S. Pat. No. 3,832,700 where a film of a ferroelectric substance is disposed at a gate of an MIS transistor. Still another geometry for the non-volatile memory which has recently been proposed is described in a paper by Kinney, et al., published in IEDM 87 at pages 850-851. According to this proposal, films are laminated on an MOS semiconductor device as depicted in FIG. 11 of the accompanying drawing.

Figure 11:
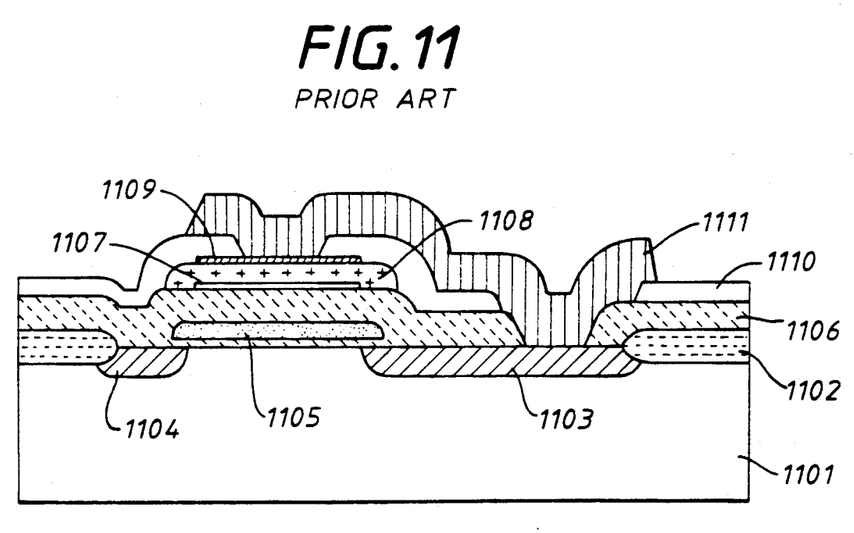
FIG. 11 is a cross-sectional view depicting the principal portion of a conventional semiconductor device and has already been described above.

FIG. 11 is a cross-sectional view illustrating the structure of a ferroelectric capacitor memory cell formed on a p-type silicon substrate 1101 and isolated from adjacent components by an LOCOS field oxide film 1101.

The cell itself is composed of an MOS transistor which is formed by an N-type diffused layer 1103 serving as a source, an N-type diffused layer 1104 serving as a drain, a gate electrode 1105, and an inter-layer insulating film 1106. The cell further includes a film 1108 of ferroelectric material sandwiched between two electrodes 1107 and 1109 to create a ferroelectric capacitor on insulating film 1106 above gate 1105. The cell is completed by a second inter-layer insulating film 1110 and an aluminum connection electrode 1111.

A structure of the type shown in FIG. 11 offers the advantage that it can be placed in a small area. However, manufacture requires a large number of steps to additionally form the upper and lower electrodes, a ferroelectric material film and a second inter-layer insulating film as compared with an ordinary semiconductor device. Supposing that a ferroelectric material film exhibiting satisfactory properties can be obtained, there still exists the problem of cost resulting primarily from the number of manufacturing steps.

SUMMARY OF THE INVENTION

It is a primary object of the present invention to obviate the foregoing problems peculiar to such prior art semiconductor devices.

A further object of the invention is to provide a novel semiconductor device, particularly a non-volatile memory, which can be manufactured at low cost with a reduction in the number of manufacturing steps even when providing a ferroelectric material film.

To this end, according to one aspect of the invention, there is provided a semiconductor device in which a ferroelectric material film is integrated on the same semiconductor substrate on which an active element is formed, which device includes a high-concentration diffused layer formed on the semiconductor substrate and identical with a lower electrode for sandwiching the ferroelectric material film in combination with another electrode.

According to another aspect of the invention, there is provided a semiconductor device in which a ferroelectric material film is integrated on the same semiconductor substrate on which an active element is formed, which device includes a lower electrode composed mainly of a metal for sandwiching the ferroelectric material film in combination with another electrode, and the ferroelectric material film is connected via the foregoing electrode directly to a high-concentration diffused layer formed on the semiconductor substrate at a contact hole.

In this configuration of the semiconductor device of the present invention, the lower electrode consists essentially of Pt, Mo, Ti, W, Ta, or Ni.

Furthermore, the lower electrode consists essentially of a metal silicide of PT, MO, Ti, W, Ta, or Ni.

The contact area between the ferroelectric material film and the high-concentration diffused layer serving as the bottom electrode is smaller than the contact area of the upper electrode.

According to still another aspect of the invention, there is provided a ferroelectric memory in which a capacitor element using a ferroelectric film and an MOS transistor are integrated on the same semiconductor substrate, in which a lower electrode of the capacitor element is a high-concentration diffused layer serving as a source or a drain of the MOS transistor and is constructed, in a self-aligning manner, of an element separating region and an insulating material formed on a side wall of a gate electrode.

According to a further aspect of the invention, there is provided a ferroelectric substance memory in which a capacitor element using a ferroelectric substance film and an MOS transistor are integrated on the same semiconductor substrate, in which a lower electrode of the capacitor element is a silicide made of a refractory metal shaped on a high-concentration diffused layer serving as a source or a drain of the MOS transistor and is constructed, in a self-aligning manner, of an element separating region and an insulating material formed on a side wall of a gate electrode.

According to a still further aspect of the invention, there is provided a ferroelectric substance memory in which a capacitor element using a ferroelectric substance film and an MOS transistor are integrated on the same semiconductor substrate, in which a lower electrode of the capacitor element is a high-concentration diffused layer serving as a source or a drain of the MOS transistor and is constructed, in a self-aligning manner, of an element separating region, a gate electrode and insulating materials shaped on side walls of an insulating film formed on the gate electrode to assume the same configuration as that of this gate electrode.

According to yet another aspect of the invention, there is provided a ferroelectric substance memory in which a capacitor element using a ferroelectric substance film and an MOS transistor are integrated on the same semiconductor substrate, in which a lower electrode of the capacitor element is a silicide made of a refractory metal formed on a high-concentration diffused layer serving as a source or a drain of the MOS transistor and is constructed, in a self-aligning manner, of an element separating region, a gate electrode and insulating materials shaped on side walls of an insulating film formed on the gate electrode to assume the same configuration as that of the gate electrode.

In the thus constructed ferroelectric memories, the silicide is any one of metal silicides of Pt, Mo, Ti, W, Ta, and Ni.

BRIEF DESCRIPTION OF THE DRAWING

Other objects and advantages of the present invention will become apparent from the following discussion taken in conjunction with the accompanying drawings, in which.

DESCRIPTION OF THE PREFERRED EMBODIMENTS

Figure 1:
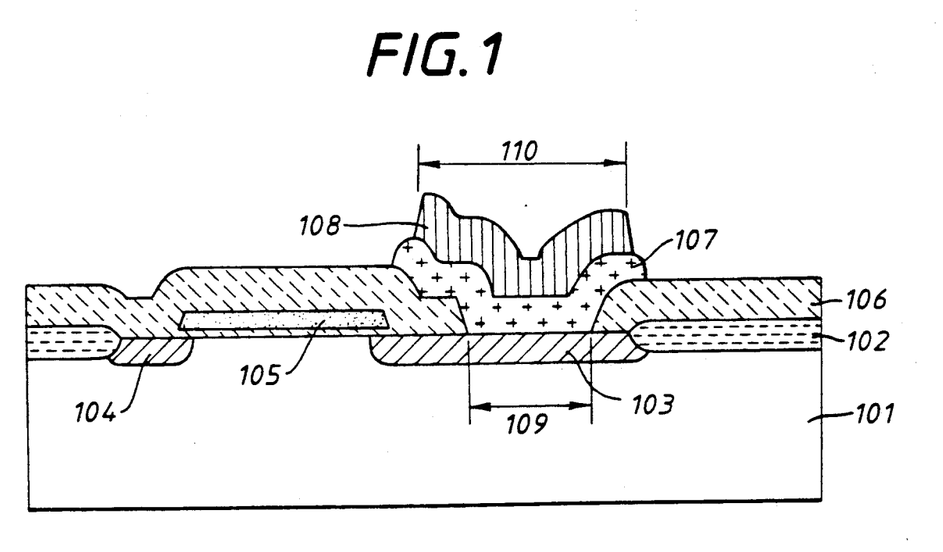
FIGS. 1, 3, 5, 7, 8, 9 and 10 are cross-sectional views each showing the principal portion of an embodiment of a semiconductor device according to the present invention.

FIG. 1 shows one embodiment of a semiconductor device according to the present invention. Solely to facilitate the explanation, the illustrated embodiment will be assumed to include a silicon substrate and an N-channel transistor.

A silicon substrate 101 of a first conductivity type, e.g. P-type is constructed by using a wafer having a specific resistance of, e.g., 20 ohm. cm. An insulating film 102 for isolating an o. element is created by forming an oxide film to having a thickness of 6000 Å by a conventional technique, i.e., an LOCOS method. A diffused layer 103 of a 2nd conductivity type opposite to the first conductivity type, e.g. N-type serving as a source is formed by effecting phosphorus ion-implantation at 80 KeV and a dose of 5E15 cm$^{-2}$ for example. An N-type diffused layer 104 serving as a drain is formed concurrently with, and by the same process as, diffused layer 103.

Formation of a gate electrode 105 involves the use of phosphorus-doped polysilicon. An inter-layer insulating film 106 is obtained by depositing a phosphorus glass to a thickness of 6000 Å by, e.g., a chemical vapor deposition method. A contact hole 109 is formed in inter-layer insulating film 106 and in other portions (not illustrated) the hole serves to connect a wiring electrode to diffused layer 103 or the polysilicon 105. A ferroelectric material film 107 is formed in contact hole 109 directly on N-type high-concentration diffused layer 103. The material for the ferroelectric film can be, e.g., $PbTiO_3$, PZT ($PbZrO_3$ and $PbTiO_3$) and PLZT (La, $PbZrO_3$ and $PbTiO_3$. An electrode 108 made of, for instance, Al also serves as a wiring electrode in other portions (not shown).

The structure shown in FIG. 1 includes a capacitor incorporating ferroelectric film 107 and arranged such that the N-type high-concentration diffused layer 103 is a lower electrode of the capacitor, while wiring electrode 108 made of Al is the upper electrode of the capacitor. Based on this geometry, the only step added to the process of making the transistor is the step of forming the ferroelectric film 107 as compared with the steps of manufacturing an ordinary MOS semiconductor device. Hence, a semiconductor device employing the ferroelectric film can be fabricated at low cost. The diameter 110, or area, of Al upper electrode 108 is made larger than the corresponding size of hole 109. As a result, the effective area of the capacitor can be determined by the size of contact hole 109. Thus, the capacitor with a small amount of scattering can be constructed.

A method of manufacturing the semiconductor device of the invention will be described with reference to FIGS. 2(a), 2(b) and 2(c) which illustrate stages in the manufacture.

Figure 2A:
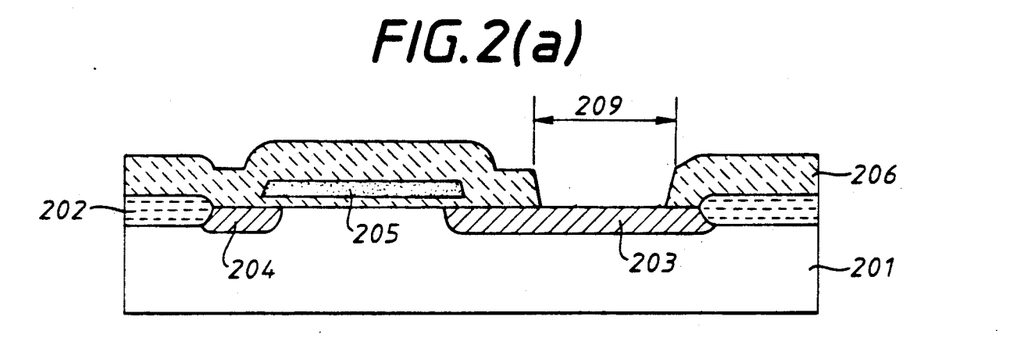
FIGS. 2(a) to 2(c), 4A-4C and 6(a) to 6(f) are cross-sectional views illustrating fundamental steps in the manufacture of semiconductor devices of the invention.

Referring first to FIG. 2(a), on a silicon substrate 201 there are formed an element isolating film 202, N-type diffused layers 203 and 204, a gate electrode 205 and an inter-layer insulating film 206. Subsequently, a contact hole 209 is formed in film 206. This configuration can be obtained by conventional techniques.

Figure 2B:
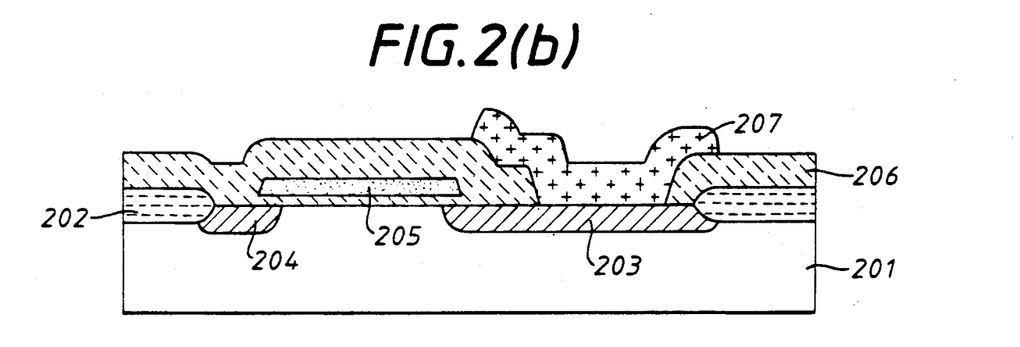

Referring next to FIG. 2(b), thereafter a ferroelectric film 207 is provided by depositing $PbTiO_3$ up to a thickness of approximately 5000 Å by a sputtering method. Sputtering is effected under such conditions that: for instance, the gas ratio of Ar to oxygen is 90% to 10%; as a target there is employed $PbTiO_3$ to which an additional 5–10% of Pb is added; and RF sputtering power is set at 200 W. Then, annealing is effected at 600° C. for an hour in an $N_2$ atmosphere, thereby improving the crystalline properties of the ferroelectric film.

Subsequently, ferroelectric film 207 is shaped to a predetermined pattern by a conventional photographic exposure method. Etching of the ferroelectric film involves the use of a mixed liquid of, e.g., hydrochloric acid and hydrofluoric acid. Methods of etching the ferroelectric film may include ion milling which uses Ar gas or dry etching which employs an adequate reactive gas.

Figure 2C:
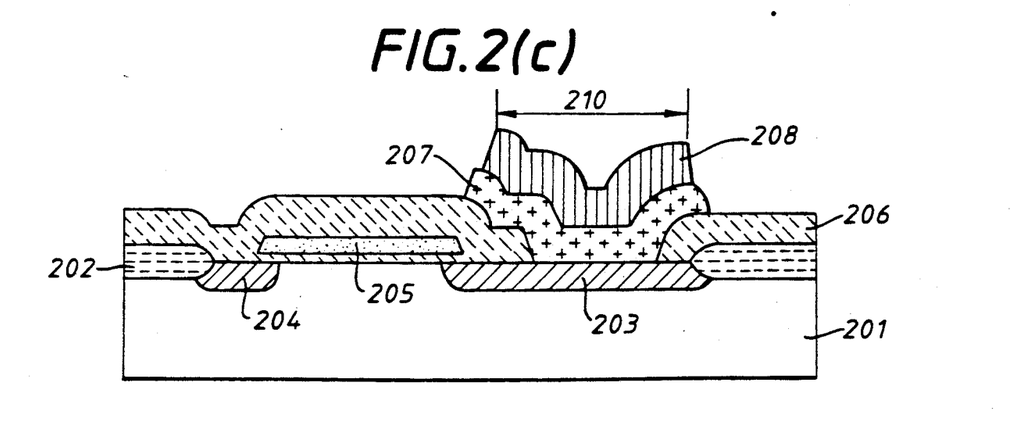

Turning to FIG. 2(c), a 1 μ thick upper electrode 208 of aluminum is formed by sputtering. The electrode is shaped to a desired pattern by a conventional photographic exposure technique. The size 210 of electrode 208 is preferably made sufficiently larger than the corresponding size of contact hole 209.

The semiconductor device is produced in the manner described above, where specific reference was made to $PbTiO_3$ as the ferroelectric material. However, the ferroelectric material can, as a matter of course, have other compositions, e.g., PZT or PLZT.

Figure 3:
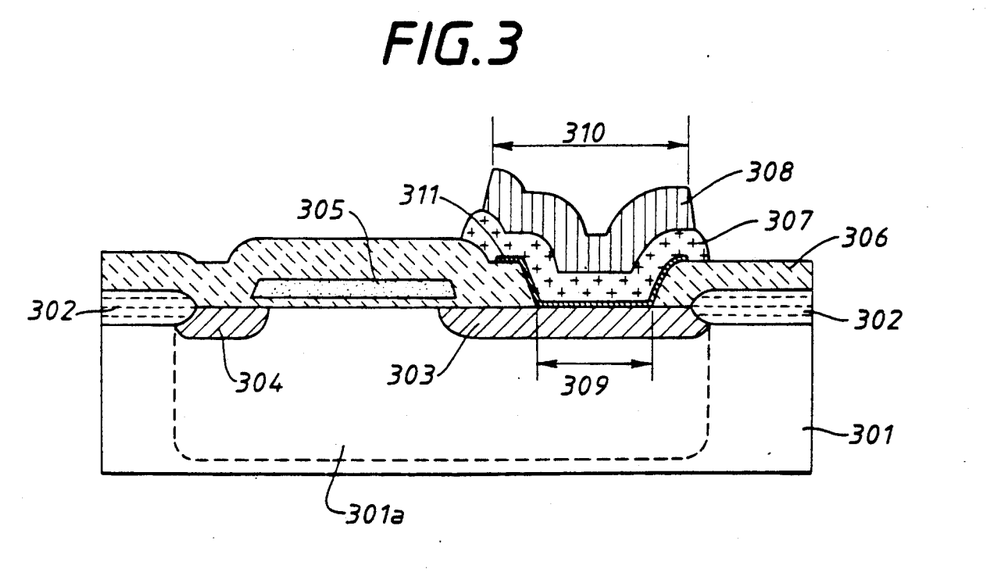

FIG. 3 is a sectional view illustrating the principal portion of a second embodiment of a semiconductor device according to the invention. There is shown a p-type Si substrate 301 having an element forming region 301a. This embodiment differs from the first embodiment by- the provision of a lower electrode 311 whose composition includes a refractory metal such as Pt, Mo, Ti, W, Ta, or Ni, and/or a refractory metal silicide of Pt, Mo, Ti, W, Ta, or Ni. Otherwise, the embodiment of FIG. 3 is identical to that of FIG. 1 and corresponding parts are identified by reference numerals which are identical except for the most significant digit.

Apropos of electric characteristics, the lower electrode according to the present invention can be defined as a metal electrode, which brings about an amelioration of the crystalline properties of the ferroelectric material. This in turn improves, when a Pt metal is used for the electrode, the number of possible information rewriting operations—i.e., from $10^8$ times to $10^{10}$ times—as compared with a case where no metal electrode is provided. This improvement offered by Pt is also exhibited, possibly to a different degree, by other metals such as Mo, Ti and W and silicides of these metals as well.

Next, a method of manufacturing the semiconductor device in the second embodiment of the invention will hereinafter be explained with reference to FIGS. 4(a) to 4(c) which depict basic steps of the method.

Figure 4A:
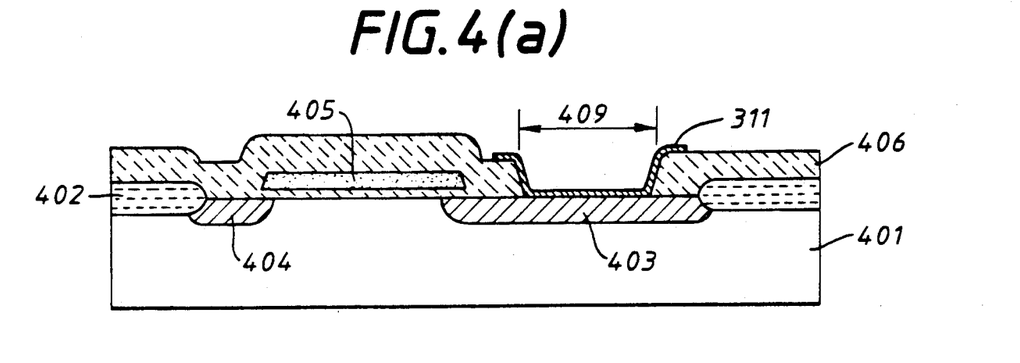

Formed on a silicon substrate 401 are, as depicted in FIG. 4(a), an element separating film 402, N-type diffused layers 403 and 404, a gate electrode 405 and an inter-layer insulating film 406. Subsequently, a contact hole 409 is formed in film 406. The geometry up to this stage can be attained by conventional techniques. Then, lower electrode 311 is formed by depositing, e.g., Pt to a thickness of approximately 1000 Å by sputtering. Based on the prior art photographic exposing method, a resist pattern is formed, and Pt electrode 311 is etched by a sputter-etching method.

Figure 4B:
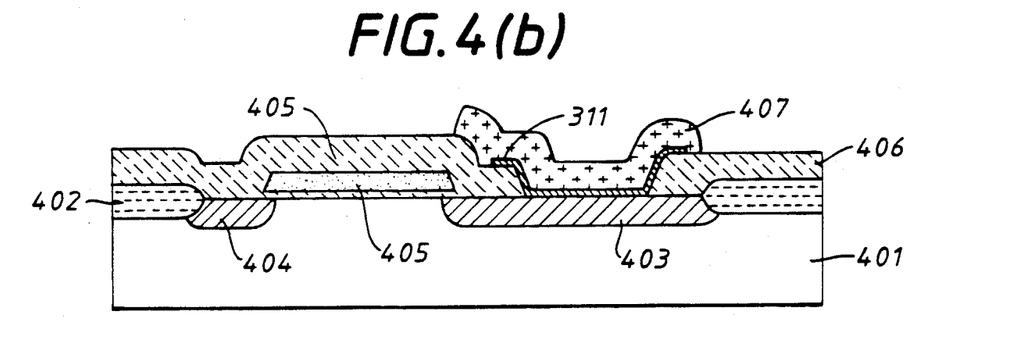
Figure 4C:
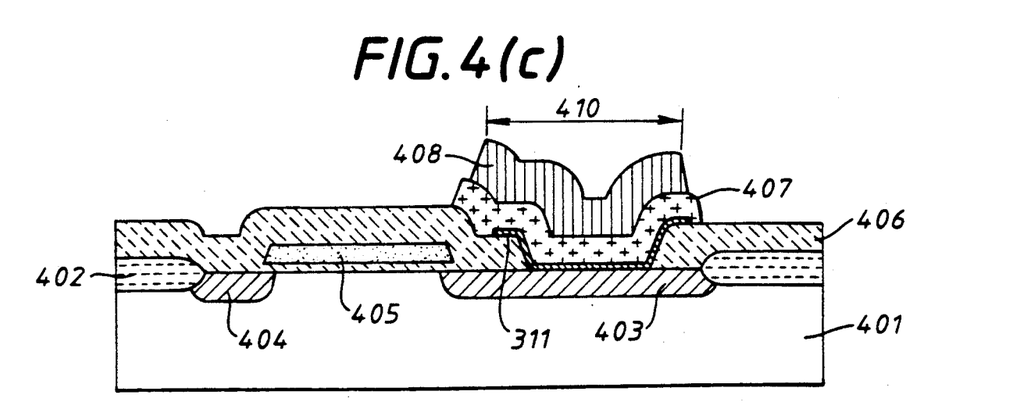

Referring to FIGS. 4(b) and 4(c), the second embodiment can be fabricated by performing the same steps as those of the first embodiment, to form ferroelectric film 407 and wiring electrode 408 which correspond to elements 307 and 308 of FIG. 3.

Figure 5:
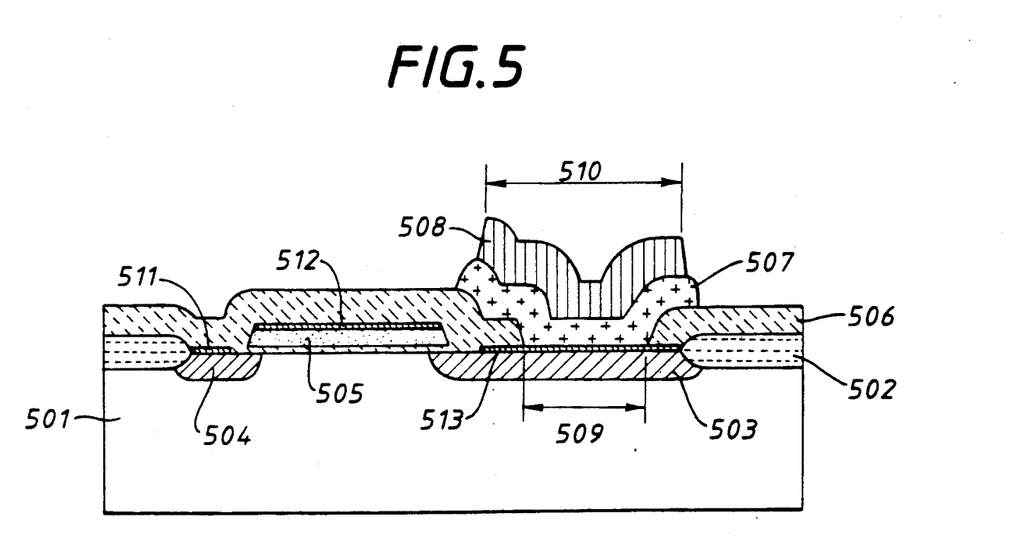

FIG. 5 is a cross-sectional view depicting the principal portion of a third embodiment of the invention. Refractory metal silicides, which will serve as a lower electrode are formed on a gate, a source and a drain. This is a different geometry from the first and second embodiments. Indicated at 511, 512 and 513 are silicides formed simultaneously on a drain diffused layer 504, a gate electrode 505 and a source diffused layer 503. The method of manufacturing silicide layers 511, 512 and 513 will be described below.

This embodiment includes a capacitor composed of a ferroelectric film 507, and a lower electrode consisting of refractory metal silicide 513. If, for instance, Pt is employed as the refractory metal, it is possible to obtain a ferroelectric film exhibiting excellent crystalline properties. Annealing intended to improve the crystalline properties after forming ferroelectric film 507 is allowed to be effected in the vicinity of, e.g., 900° C. because of the specific refractory metal used. It is therefore feasible to shape a ferroelectric substance film having more excellent crystalline properties.

In connection with electric characteristics, the lower electrode consists of a refractory metal silicide according to the present invention and the amelioration of the crystalline properties of the ferroelectric film leads to such an improvement that when the electrode is formed of, for example, a Pt silicide, the possible number of information rewriting operations increases from $10^8$ times to $10^{10}$ times as compared with a case where no metal electrode is provided. This result of employing a Pt silicide can, to a more or less different in degree, be achieved with other refractory metals such as Mo, Ti, Pt and W.

A method of manufacturing a semiconductor device according to the third embodiment of the invention will hereinafter be described with reference to FIGS. 6(a) to 6(f) which illustrate principal steps in the practice of this method.

Figure 6A:
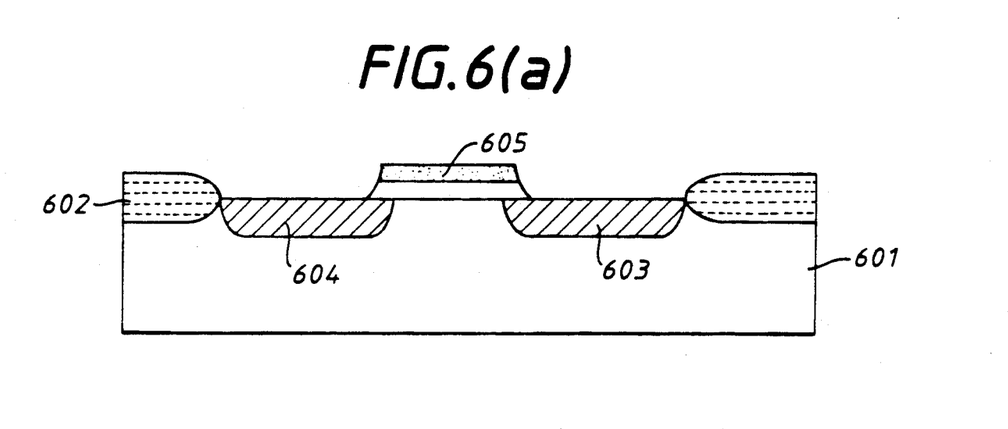
Figure 6B:
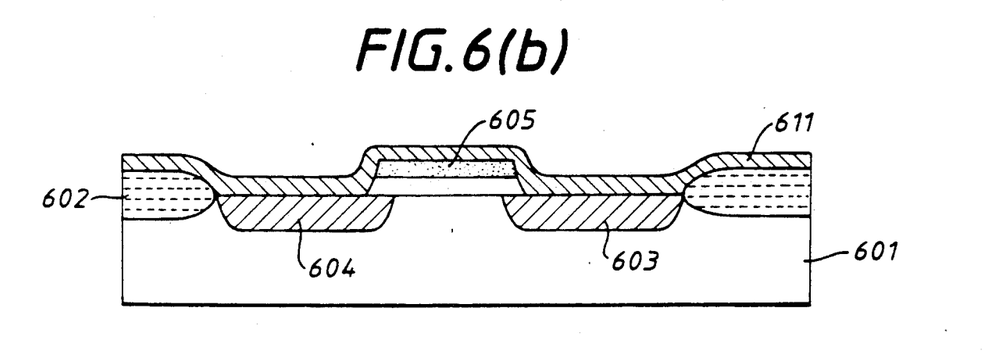

Formed on a silicon substrate 601, as depicted in FIG. 6(a), are an element separating film 602, N-type diffused layers 603 and 604 and a poly Si gate electrode 605. Then, as shown in FIG. 6(b), a layer 611 of, for example, Ti is deposited to a thickness of about 1000 Å. The assembly is then subjected to an annealing operation at 800° C. for 30 seconds, thereby forming TiSi at the locations where Ti film 611 contacts silicon.

Figure 6C:
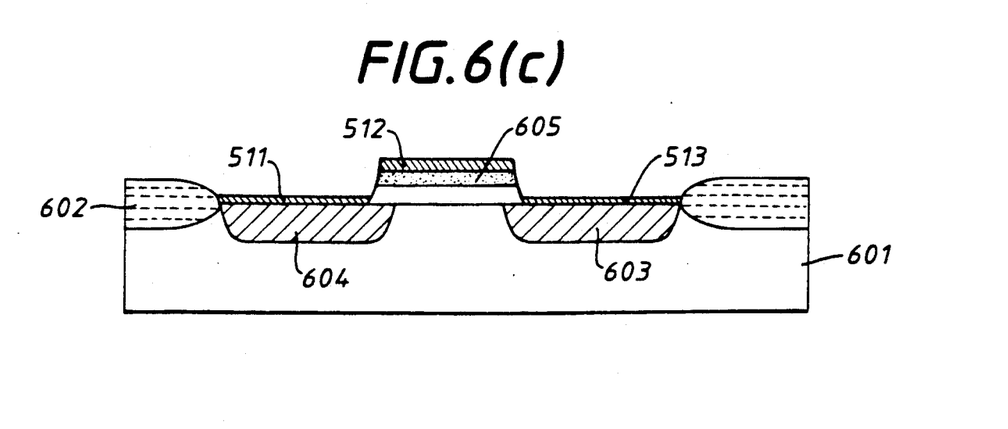

Then, the film 611 is selectively etched away only at those locations where the film does not contact silicon, and thus remains in the form of Ti. This etching may be a wet etching using a mixture of $NH_4OH$, $H_2O_2$ and $H_2O$. The TiSi regions of layer 611 are not etched away and form silicide layers 511, 512 and 513 as shown in FIG. 6(c). Layers of a refractory metal silicide other than TiSi can be formed in a similar manner.

Figure 6D:
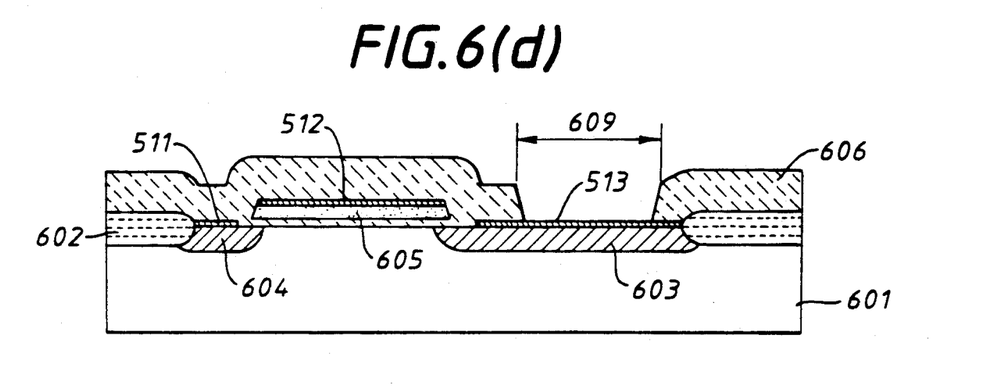
Figure 6E:
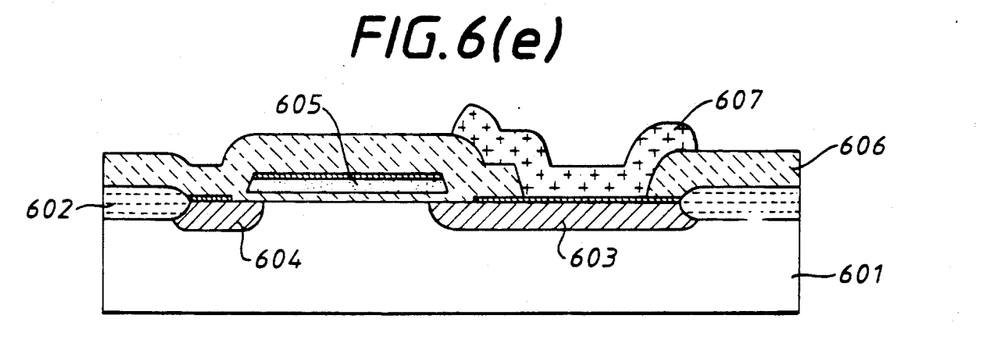
Figure 6F:
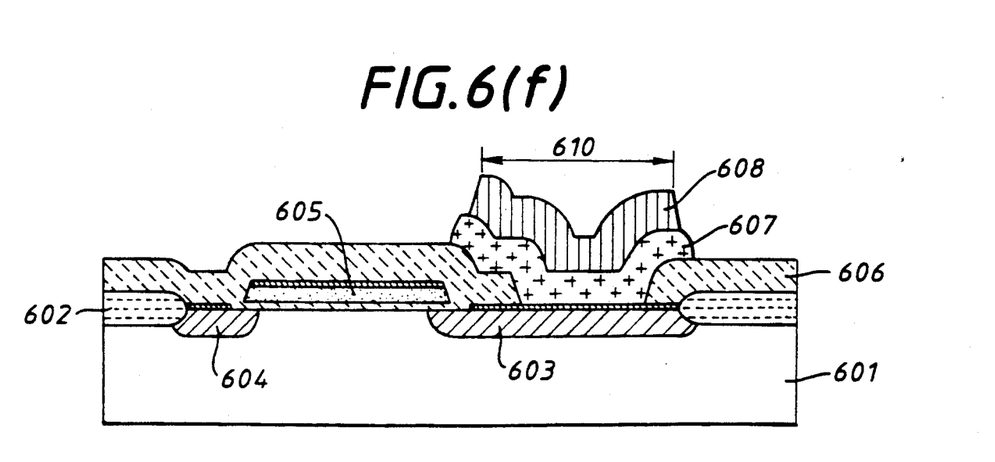

Then, as shown in FIG. 6(d), an inter-layer insulating film 606 is formed and a contact hole 609 is created in film 606. As shown in FIG. 6(e), a ferroelectric film 607 is formed in contact hole 609 directly on silicide layer 513 and, as shown in FIG. 6(f), a wiring electrode 608 is formed on film 607. The steps shown in FIGS. 6(d), 6(e) and 6(f) are the same as those employed in the manufacture of the embodiment of FIG. 1.

Figure 7:
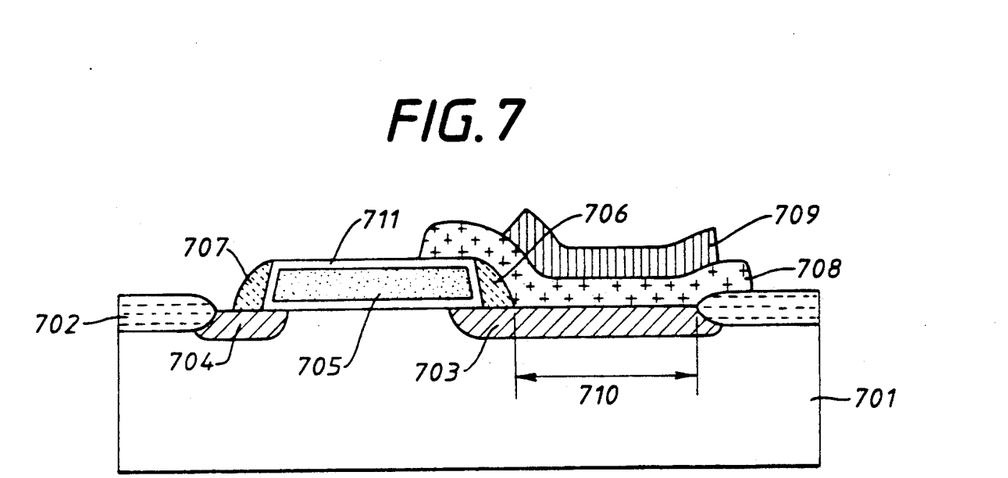

There will next be described an exemplary case where the present invention is applied to a memory, as shown in FIG. 7.

A P-type silicon substrate 701 is part of a wafer having a specific resistance of, e.g., 20 ohm cm. An element isolating insulating film 702 is produced by depositing an oxide film to a thickness up to 6000 Å on the basis of the prior art LOCOS method. An N-type diffused layer 703 functioning as a source is created by effecting, e.g., phosphorus ion-implantation at 80 KeV and an impurity dose of $5E15$ $cm^{-2}$, for example. An N-type diffused layer 704 serving as a drain is formed at the same time as N-type diffused layer 703. Formation of a gate electrode 705 involves the use of, for instance, phosphorus-doped polysilicon.

Insulating film 711 is formed so that it covers polysilicon gate electrode 705. After formation of the polysilicon gate, wet oxidation, or oxidation in steam, is carried out at 850° C. for 1 hour, for example. As a result, an SiO film having a thickness of 2000 Å is formed to cover the polysilicon gate. During this oxidation, an oxide film on the Si substrate, where source 703 and drain 704 are located, grows only to a thickness of 500 Å and the oxide film on source 703 and drain 704 is removed by a prior art method, such as by etching back or wet-etching, after oxidation. Thus, an oxide film is left only at the peripheral portion of the polysilicon gate.

The gate electrode is provided with insulating film side walls 706 and 707 shaped on both sides of gate electrode 705 and defined as one of the components of the present invention. The side walls can be formed by the steps of depositing, e.g., an SiO$_2$ film over the surface to have a thickness of, e.g., 6000 Å by the chemical vapor deposition method and thereafter performing etch-back on the entire surface. The method of shaping the side walls is identical with a method of forming a transistor of LDD (Lightly Doped Drain) structure.

Formation of a ferroelectric film 708 constituting a ferroelectric capacitor requires the steps of depositing, e.g., PZT to a thickness of 5000 Å over the surface by sputtering and subsequently performing a patterning process to a predetermined pattern by dry etching. An upper electrode 709 formed of, e.g., Al is provided to serve as a wiring electrode of the transistor.

In the embodiment of FIG. 7, the lower electrode is a high impurity concentration diffused layer 703 and the outline of this electrode is defined by the element separating region 702 and the side wall 706 in a self-matching, or self-aligning, manner, as a result of which the efficiency of capacitor area 710 becomes large. Besides, the capacitor can be made so that the size of area 710 remains within narrow limits. In terms of manufacturing steps, manufacture of the device of FIG. 7 requires addition of only the step of forming the ferroelectric substance film 708 to the steps of forming a transistor thereby attaining current integration with facility.

Figure 8:
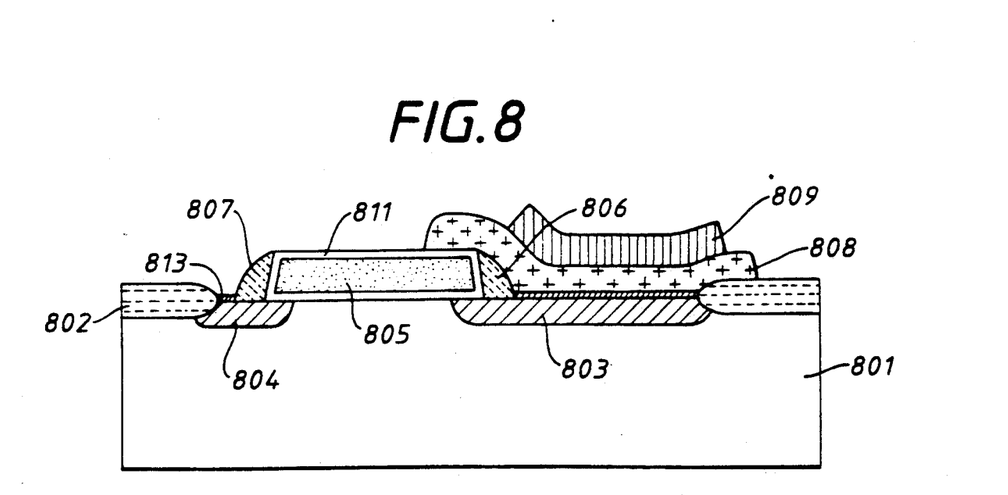

FIG. 8, shows a modified version of the embodiment of FIG. 7 in which a refractory metal silicide film 812 is used for the lower capacitor electrode. In this embodiment, a refractory metal silicide film 813 is also formed. This embodiment can be produced by the method shown in FIGS. 6(a)–6(f), except that in the embodiment of FIG. 8 silicide is not formed on the gate electrode because it is covered with SiO$_2$. As stated earlier, the silicide layer 812 serves as the capacitor lower electrode, which arrangement makes possible an improvement of the crystalline properties of the ferroelectric film 808 because the lattice constant of Pt is generally similar to that of PZT. Therefore, when Pt is used as an electrode and PZT is formed on Pt and annealed, the PZT formed on the Pt provides good crystalline properties. A PZT film with good crystalline properties provides good electrical properties. In the case of Pt silicide, the same effects can be obtained.

The material of the ferroelectric film may include, for example, PbTiO$_3$, PZT (PbZrO$_3$ or PbTiO$_3$) or PLZT (La. PbZrO$_3$ or PbTiO$_3$).

The description given above has dealt with the LOCOS film as an element separating film. A feature of the present invention, however, lies in the arrangement wherein the pattern of the lower electrode is determined by the boundary of the element separating film 802 and the side wall 806 in the self-matching manner. Hence, the present invention can, as a matter of course, be applied to a separating method which uses a trench. It is also obvious that there exists a diversity in geometry—i.e., the invention can be applied to a CMOS structure, a bipolar structure, or a bipolar/CMOS structure.

Figure 9:
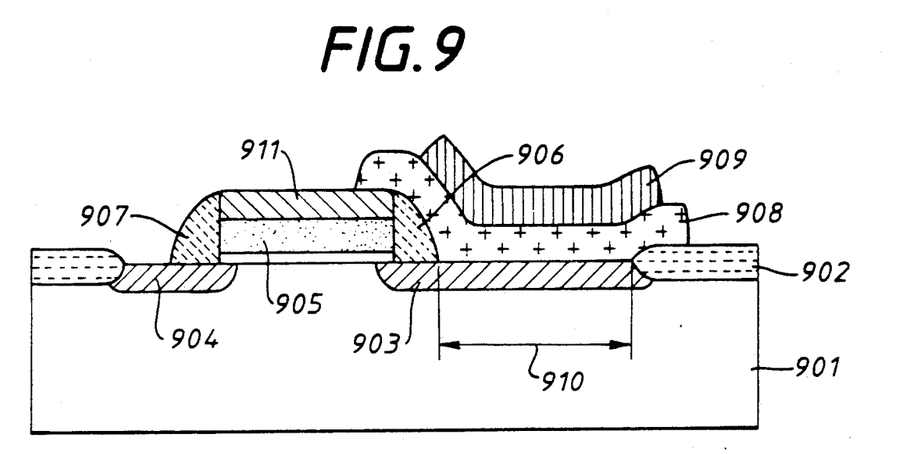

FIG. 9 shows a second modified version of the embodiment of FIG. 7. In contrast to the embodiment of FIG. 7 where oxide film 711 completely surrounds gate electrode 705, in the embodiment of FIG. 9, an oxide film 911 is formed only on the top of gate electrode 905 and side wall insulating films 906 and 907 are formed on the side walls of gate electrode 905 and insulating film 911. This structure provides two advantages: (1) the lower electrode area 910 of ferroelectric capacitor 903, 908, 909 is determined in a self-aligning manner by the edges of element isolating film 902 and side-wall insulating film 906; and (2) since insulating film 911 in gate electrode 905 is formed to a substantial thickness, effective insulation will be established between electrode 905 and an overlying wire electrode of, for example, Al.

An insulating film 911 conceived as one of the components of the invention is formed on gate electrode 905 to assume the same configuration. A method of shaping gate electrode 905 and insulating film 911 comprises the steps of: firstly depositing, e.g., polysilicon, which will become a gate electrode, on the entire surface up to approximately 4000 Å by a vacuum CVD method; doping the polysilicon by thermal diffusion with the aid of, e.g., POCl$_3$; thereafter depositing, for example, SiO$_2$ to a thickness of approximately 5000 Å similarly by the chemical vapor deposition method to thereby obtain the insulating film 911; forming a predetermined resist pattern by the conventional exposing method in this state; and simultaneously etching the SiO$_2$ of insulating film 911 and the polysilicon of gate electrode 905 by, e.g., dry etching. The geometry depicted in FIG. 9 is thus obtained.

Side walls 906 and 907 defined as one of the components of the invention are formed, on both sides of gate electrode 905, on side surfaces of the insulating film 911 shaped on this gate electrode. The side walls are shaped in such a way that, for instance, an SiO$_2$ film having a thickness of 1 μ is formed on the whole surface of electrode 95 by, e.g., the vapor growth method, and subsequently etch-back is effected over the surface. The method of forming these side walls is identical with an approach to formation of a transistor having an LDD structure. A ferroelectric film 908 constituting the dielectric of a ferroelectric capacitor, is formed by depositing, e.g., PZT over the surface to have a thickness of 5000 Å by sputtering, and subsequently patterning it to a predetermined pattern by dry etching. An upper electrode 909 made of, e.g., Al is provided to serve as a wiring electrode of the transistor.

In accordance with the embodiment shown in FIG. 9, a high-concentration diffused layer 903 functions as a lower electrode whose active shape is defined by element separating region 902 and the side wall 906 in the self-aligning manner. With this arrangement, the efficiency of a capacitor effective area 910 increases, and it is also possible to constitute the capacitor to have a small area tolerance. An insulating film having the same configuration as the gate electrode 905 is formed thereon, which makes it feasible to manufacture a ferroelectric memory having a small quantity of parasitic capacitance between gate electrode 905 and an upper electrode 909 or undergoing no influence of a potential of the gate electrode 905 on the ferroelectric film 908. In terms of the manufacturing steps, an addition of the step of forming the ferroelectric film 908 to those in the prior art may suffice, thereby attaining integration with facility.

Figure 10:
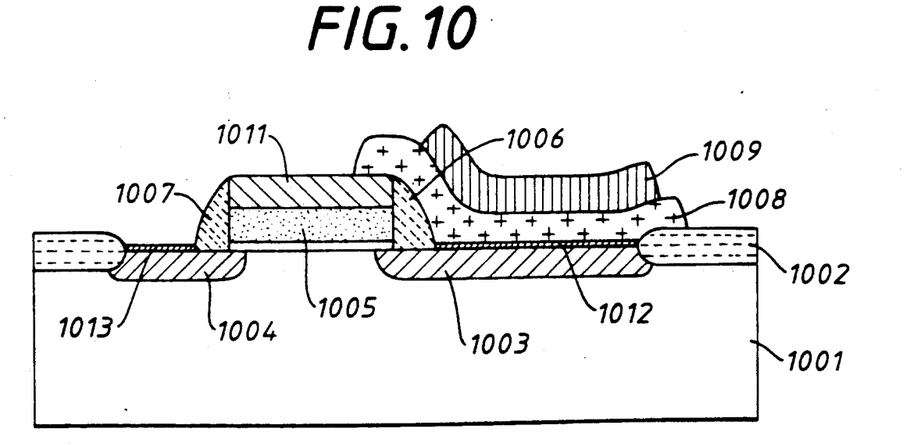

FIG. 10 shows a modified version of the embodiment of FIG. 9 in which refractory metal silicide film 1012 is provided as the lower electrode of a ferroelectric capacitor which also includes a ferroelectric film 1008 and an upper electrode 1009. In this embodiment, a refractory metal silicide film 1013 is also provided. This embodiment can be fabricated according to the method shown in FIGS. 6(a)–6(f), except that silicide will not be formed on gate electrode 1005 because of the presence of SiO$_2$ layer 1011. As discussed above, the silicide serves as the lower electrode, whereby in the case of using, e.g., a Pt silicide, with PZT used for the ferroelectric substance film, the lattice constants are similar. It is therefore possible to improve the crystalline properties of the ferroelectric substance film.

Materials of the ferroelectric film can include, for example, $PbTiO_3$, PZT ($PbZrO_3$ and $PbTiO_3$) and PLZT (La, $PbZrO_3$ and $PbTiO_3$).

As discussed above, semiconductor devices according to the invention are characterized by arrangements in which the ferroelectric film is formed directly on a diffused layer serving as the source or the drain of the associated MOS transistor; or in which the lower electrode for sandwiching the ferroelectric film in cooperation with another electrode is composed mainly of a metal, and at the contact hole the ferroelectric film is connected via the foregoing electrode directly to the high-concentration diffused layer formed on the semiconductor substrate; or in which layer formed on the semiconductor substrate; or in which the silicide composed chiefly of the refractory metal is formed on the high-concentration diffused layer serving as the source or the drain which is shaped on the semiconductor substrate, and the ferroelectric substance film exhibiting excellent crystalline properties is formed directly on the silicide by performing a small number of steps. Hence, the present invention creates such advantages that it is possible to manufacture the semiconductor device, particularly the non-volatile memory, at low costs by a small number of steps and also obtain a ferroelectric film having superb crystalline properties.

Although the illustrative embodiments of the present invention have been described in detail with reference to the accompanying drawings, it is to be understood that the present invention is not limited to those precise embodiments. A variety of modifications and changes may be effected therein by one skilled in the art without departing from the scope or spirit of the invention.

This application relates to subject matter disclosed in Japanese Patent Applications No. 28940/89, filed on Feb. 8, 1989, No. 28941/89, filed Feb. 8, 1989, No. 54222/89, filed Mar. 7, 1989, No. 125804/89, filed May 19, 1989, and No. 125805/89, filed May 19, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A ferroelectric memory device comprising:
   a semiconductor substrate having a surface and an element forming region of a first conductivity type said substrate being provided with an insulating layer formed on said surface and constituting an isolating region surrounding said element forming region of said substrate, said substrate being further provided with at least one impurity diffused region layer of a second conductivity type opposite to the first conductivity type located in said element forming region and extending into said substrate from said surface;
   an MOS transistor formed in said element forming region of said substrate and including a source region of the second conductivity type, a drain region of the second conductivity type, a gate electrode having a side wall, and a body of insulating material on said gate electrode side wall and contacting said substrate surface, with one of said drain region and said source region being constituted by said at least one diffused region; and
   a ferroelectric capacitor formed on said substrate in said element forming region together with said transistor and comprising capacitor electrodes and a ferroelectric film of PZT sandwiched between said capacitor electrodes;
   wherein a portion of said diffused region layer is bordered, at said substrate surface, by said element isolating region and said body of insulating material, and wherein one of said capacitor electrodes comprises a metal layer of Pt formed directly on said diffused region portion.

2. A ferroelectric memory device comprising:
   a semiconductor substrate having a surface and an element forming region of a first conductivity type said substrate being provided with an insulating layer formed on said surface and constituting an isolating region surrounding said element forming region of said substrate, said substrate being further provided with at least one impurity diffused region of a second type opposite to the first conductivity type located in said element forming region and extending into said substrate from said surface;
   an MOS transistor formed in said element forming region of said substrate and including a source region of the second conductivity type, a drain region of the second conductivity type, a gate electrode having a side wall, and a body of insulating material on said gate electrode side wall and contacting said substrate surface, with one of said drain region and said source region being constituted by said at least one diffused region; and
   a ferroelectric capacitor formed on said substrate in said element forming region together with said transistor and comprising capacitor electrodes and a ferroelectric film of PZT sandwiched between said capacitor electrodes;
   wherein a portion of said diffused region is bordered, at said substrate surface, by said element isolating region and said body of insulating material, and wherein one of said capacitor electrodes comprises a refractory Pt silicide layer formed directly on said diffused region portion.

3. A ferroelectric memory device comprising:
   a semiconductor substrate having a surface and an element forming region of a first conductivity type said substrate being provided with an insulating layer formed on said exposed surface and constituting an isolating region surrounding said element forming region of said substrate, said substrate being further provided with at least one impurity diffused region of a second conductivity type opposite to the first conductivity type located in said element forming region and extending into said substrate from said surface;
   an MOS transistor formed in said element forming region of said substrate and including a source region of the second conductivity type, a drain region of the second conductivity type, a gate electrode having side walls, an insulating film disposed on said gate electrode to have the same configuration as said gate electrode, and a body of insulating material disposed on said insulating film adjacent said gate electrode side walls and contacting said substrate surface; and a ferroelectric capacitor formed on said substrate in said element forming region together with said transistor and comprising capacitor electrodes and a ferroelectric film of PZT sandwiched between said capacitor electrodes;

wherein a portion of said diffused region is bordered, at said substrate surface, by said element isolating region and said body of insulating material, and wherein one of said capacitor electrodes comprises a metal layer of Pt formed directly on said diffused region portion.

4. A ferroelectric memory device comprising:

a semiconductor substrate having a surface and an element forming region of a first conductivity type said substrate being provided with an insulating layer formed on said exposed surface and constituting an isolating region surrounding said element forming region of said substrate, said substrate being further provided with at least one impurity diffused region of a second conductivity type opposite to the first conductivity type located in said element forming region and extending into said substrate from said surface;

an MOS transistor formed in said element forming region of said substrate and including a source region of the second conductivity type, a drain region of the second conductivity type, a gate electrode having side walls, an insulating film disposed on said gate electrode to have the same configuration as said gate electrode, and a body of insulating material disposed on said insulating film adjacent said gate electrode side walls and contacting said substrate surface; and a ferroelectric capacitor formed on said substrate in said element forming region together with said transistor and comprising capacitor electrodes and a ferroelectric film of PZT sandwiched between said capacitor electrodes;

wherein a portion of said diffused region is bordered, at said substrate surface, by said element isolating region and said body of insulating material, and wherein one of said capacitor electrodes comprises a refractory Pt silicide layer formed directly on said diffused region portion.

5. A semiconductor device comprising:

an MOS transistor having a source region and a drain region; and a ferroelectric capacitor electrically connected to one of said regions, said capacitor comprising a Pt silicide layer disposed on said one of said regions, a ferroelectric film of PZT disposed on said metal silicide layer and an electrode disposed on said ferroelectric film.

6. A semiconductor device comprising:

an MOS transistor having a source region and a drain region; and a ferroelectric capacitor electrically connected to one of said regions, said capacitor comprising a metal layer of Pt disposed on said one of said regions, a ferroelectric film of PZT disposed on said metal layer and an electrode disposed on said ferroelectric film.

* * * * *